US007276389B2

(12) United States Patent
Kim et al.

(10) Patent No.: US 7,276,389 B2
(45) Date of Patent: Oct. 2, 2007

(54) ARTICLE COMPRISING METAL OXIDE NANOSTRUCTURES AND METHOD FOR FABRICATING SUCH NANOSTRUCTURES

(75) Inventors: Dong-Wook Kim, San Diego, CA (US); Sungho Jin, San Diego, CA (US); In-Kyung Yoo, Yongin-shi (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 11 days.

(21) Appl. No.: 11/059,784

(22) Filed: Feb. 17, 2005

(65) Prior Publication Data

US 2007/0202673 A1 Aug. 30, 2007

Related U.S. Application Data

(60) Provisional application No. 60/547,689, filed on Feb. 25, 2004.

(51) Int. Cl.
*H01L 21/00* (2006.01)

(52) U.S. Cl. ........................................ 438/34; 977/742

(58) Field of Classification Search .................. 438/22, 438/34; 977/742–744, 840, 854, 890, 891; 205/213, 324

See application file for complete search history.

(56) References Cited

U.S. PATENT DOCUMENTS

| | | | | |
|---|---|---|---|---|
| 5,079,112 | A | 1/1992 | Berger et al. | 430/4 |
| 5,532,496 | A | 7/1996 | Gaston | 250/492.22 |
| 5,654,497 | A | 8/1997 | Hoffheins et al. | 73/23.2 |
| 5,982,095 | A | 11/1999 | Jin et al. | 313/582 |
| 6,036,774 | A | 3/2000 | Lieber et al. | 117/105 |
| 6,091,190 | A | 7/2000 | Chalamala et al. | 313/346 |
| 6,129,901 | A * | 10/2000 | Moskovits et al. | 423/447.3 |
| 6,231,744 | B1 * | 5/2001 | Ying et al. | 205/324 |
| 6,283,812 | B1 | 9/2001 | Jin et al. | 445/24 |
| 6,297,592 | B1 | 10/2001 | Goren et al. | 315/3.5 |
| 6,649,403 | B1 | 11/2003 | McDevitt et al. | 435/288.5 |
| 2004/0175844 | A1 * | 9/2004 | Yang et al. | 438/2 |
| 2005/0104056 | A1 * | 5/2005 | Nihei | 257/22 |

FOREIGN PATENT DOCUMENTS

| | | |
|---|---|---|
| JP | 2003-141986 | 5/2003 |
| KR | 10-2002-0049630 | 6/2001 |
| KR | 10-2003-0060611 | 7/2003 |

OTHER PUBLICATIONS

Ajayan, P. M. et al., Carbon nanotubes as removable templates for metal-oxide nanocomposites and nanostructures, Nature, 375, 564-567 (1995).*

Liu, J. et al., "Fullerene Pipes," Science, vol. 280 pp. 1253-1256 (May 22, 1998).

(Continued)

*Primary Examiner*—Brook Kebede
(74) *Attorney, Agent, or Firm*—Harness, Dickey & Pierce, P.L.C.

(57) ABSTRACT

This invention discloses novel field emitters which exhibit improved emission characteristics combined with improved emitter stability, in particular, new types of carbide or nitride based electron field emitters with desirable nanoscale, aligned and sharped-tip emitter structures.

16 Claims, 5 Drawing Sheets

Fabrication process of oxide nanotube array using carbon nanotube array as a template. (a) preparation of carbon nanotube/nanofiber array, (b) deposition of a metal [A] thin film, and (c) oxidation to form metal oxide [$A_MO_N$] nanotube/nanofiber array.

OTHER PUBLICATIONS

Ren, Z.F. et al., "Synthesis of Large Arrays of Well-Aligned Carbon Nanotubes on Glass," Science, vol. 282, pp. 1105-1107 (Nov. 6, 1998).

Li, W.Z. et al., "Large-Scale Synthesis of Aligned Carbon Nanotubes," Science, vol. 274, pp. 1701-1703 (Dec. 6, 1996).

Tans, Sander J. et al., "Individual single-wall carbon nanotubes as quantum wires," Nature, vol. 386, pp. 474-477 (Apr. 3, 1997).

Fan, S., et al., "Self-Oriented Regular Arrays of Carbon Nanotubes and Their Field Emission Properties," Science, vol. 283, pp. 512-514 (Jan. 22, 1999).

Bower, C. et al., "Plasma-induced alignment of carbon nanotubes," Applied Physics Letters, vol. 77, No. 6, pp. 830-832 (Aug. 7, 2000).

Bower, C. et al., "Nucleation and growth of carbon nanotubes by microwave plasma chemical vapor deposition," Applied Physics Letters, vol. 77, No. 17, pp. 2767-2769 (Oct. 23, 2000).

Merkulov, Vladimir I. et al., "Shaping carbon nanostructure by controlling the synthesis process", Applied Physics Letters, vol. 79, No. 8, pp. 1178-1180 (2001).

Teo, KBK et al., "Plasma enhanced chemical vapour deposition carbon nanotubes/nanofibres—how uniform do they grow?", Institute of Physics Publishing, Nanotechnology 14, pp. 204-211 (2003).

Tsai, C.L. et al., "Bias effect on the growth of carbon nanotips using microwave plasma chemical vapor deposition", Applied Physics Letters, vol. 81, No. 4, pp. 721-723 (2002).

Dean, Kenneth A., et al., "The environmental stability of field emission from single-walled carbon nanotubes", Applied Physics Letters, vol. 75, No. 19, pp. 3017-3019 (1999).

Mackie, W.A. et al., "Emission and Processing Requirements for Carbide Films on MO Field Emitters", Mat. Res. Soc Symp. Proc. vol. 509, pp. 173-178 (1998).

Rouse, Ambrosio A. et al., "Field emission from molybdenum carbide", Applied Physics Letters, vol. 76, No. 18, pp. 2583-2585 (2000).

Adachi, Hiroshi et al., "Stable carbide field emitter", Appl. Phys. Lett. 43 (7), pp. 702-703 (1983).

Gilmour, Jr., A.S., Microwave Tubes, Chapter 8, "Gridded Tubes", Artech House, pp. 191-313 (1986).

Huang, Michael H. et al., "Room-Temperature Ultraviolet Nanowire Nanolasers", Science, vol. 292, pp. 1897-1899 (2001).

Aggarwal, S. et al., "Spontaneous Ordering of Oxide Nanostructures", Science, vol. 287, pp. 2235-2237 (2000).

Luo, Yun et al., "Nanoshell tubes of ferroelectric lead zirconate titanate and barium titanate", Applied Physics Letters, vol. 83, No. 3, pp. 440-442 (2003).

Li, Chao et al., "$In_2O_3$ nanowires as chemical sensors", Applied Physics Letters, vol. 82, No. 10, pp. 1613-1615 (2003).

Kong, Y.C. et al., "Ultraviolet-emitting ZnO nanowires synthesized by a physical vapor deposition approach", Applied Physics Letters, vol. 78, No. 4, pp. 407-409 (2001).

Korean Office Action dated May 26, 2006 with English translation.

* cited by examiner

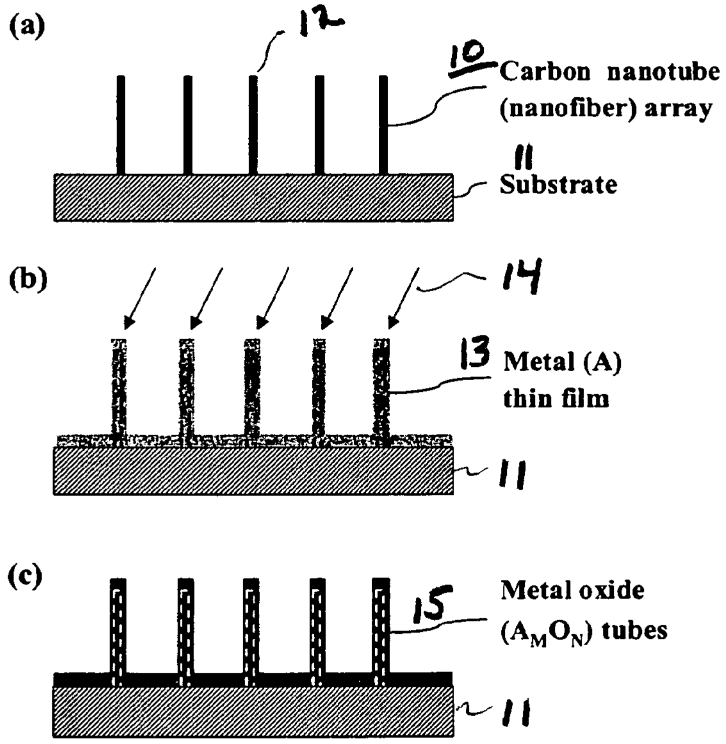
FIG. 1 Fabrication process of oxide nanotube array using carbon nanotube array as a template. (a) preparation of carbon nanotube/nanofiber array, (b) deposition of a metal [A] thin film, and (c) oxidation to form metal oxide [$A_MO_N$] nanotube/nanofiber array.

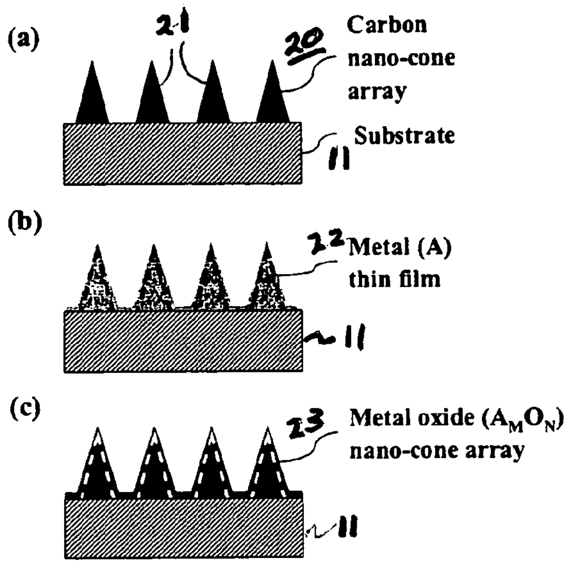

FIG. 2 Fabrication process of oxide nanotube array using carbon nanotube array as a template. (a) preparation of carbon nano-cone array, (b) deposition of a metal [A] thin film, and (c) oxidation to form metal oxide [$A_MO_N$] nano-cone array.

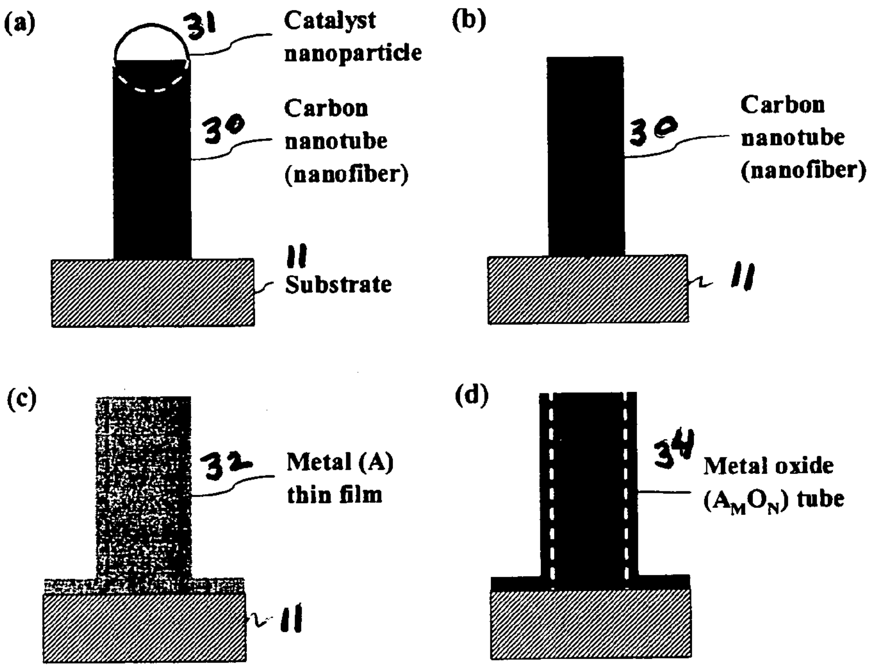

FIG. 3 Fabrication process of oxide nanotubes without catalyst particles. (a) preparation of carbon nanotubes/nanofibers, (b) selective etching (wet-etching or dry etching) of catalyst nano-particle, (c) deposition of a metal [A] thin film, and (d) oxidation to form metal oxide [$A_MO_N$] nanotube and removal of inside carbon template by burning away.

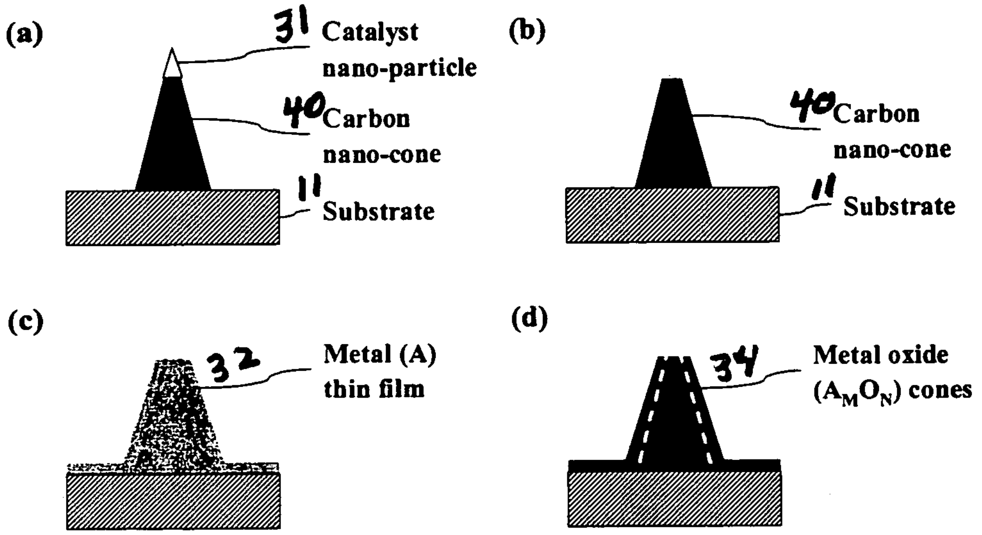

FIG. 4 Fabrication process of oxide nanotubes without catalyst particles. (a) preparation of carbon nano-cones, (b) selective etching (wet-etching or dry etching) of catalyst nano-particle, (c) deposition of a metal [A] thin film, and (d) oxidation to form hollow metal oxide [$A_MO_N$] nano-cone.

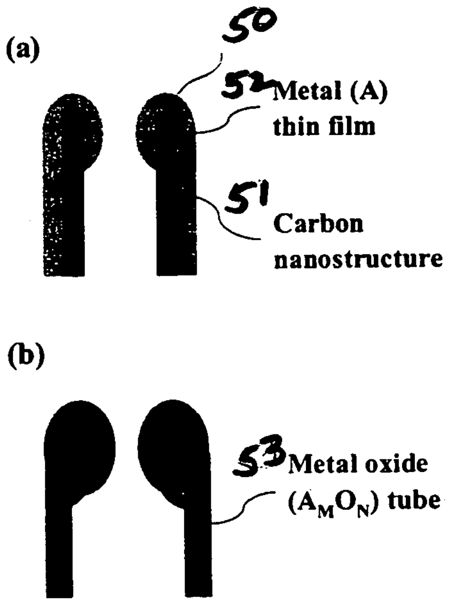

FIG. 5 Cross-sectional view of a metal oxide nanostructure (a) before oxidation and (b) after oxidation.

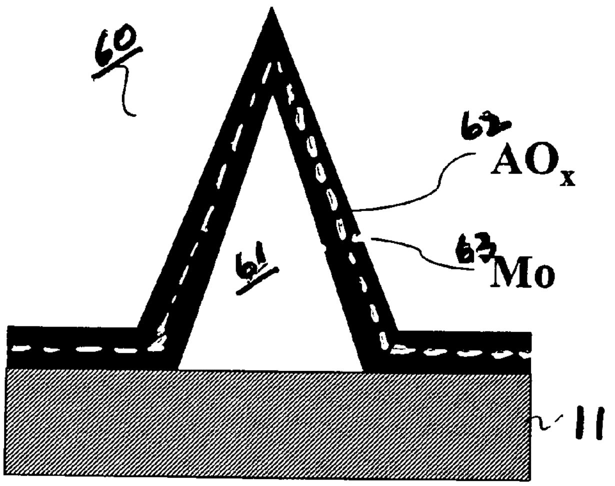
FIG. 6. Cross-sectional view of a nano-tip field emitter.
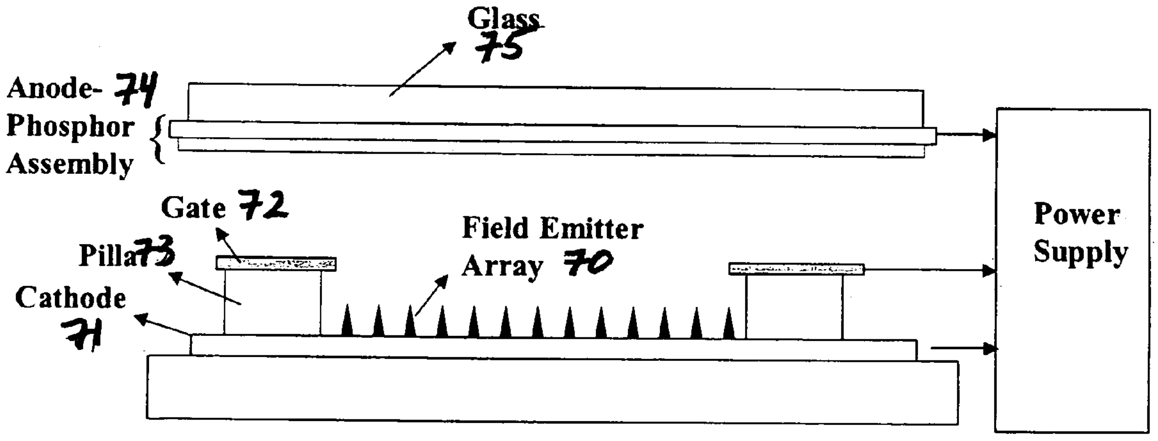
Fig. 7. Schematic field emission display using the aligned oxide nanostructure array.

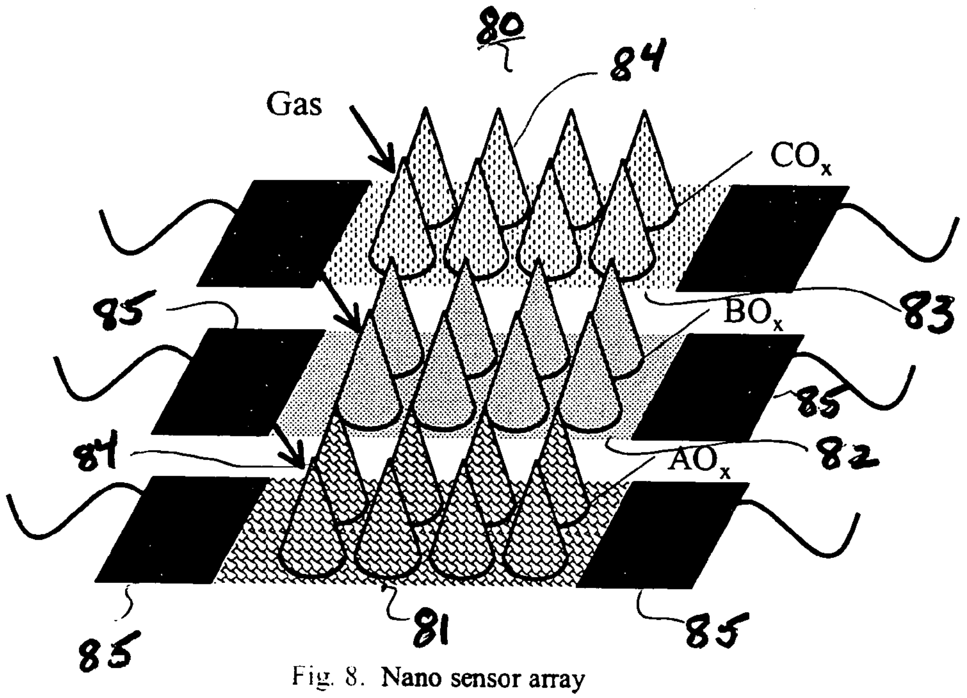
Fig. 8. Nano sensor array
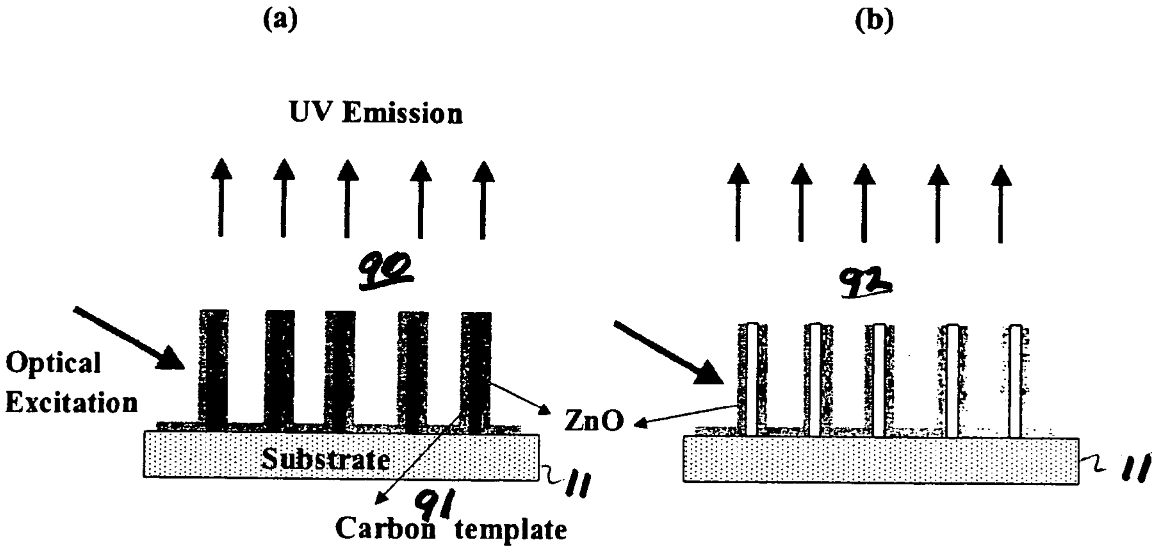
FIG. 9. UV laser emitter comprising aligned ZnO nanostructures according to the invention. (a) with the carbon template inside ZnO, (b) ZnO only with the carbon removed.

ARTICLE COMPRISING METAL OXIDE NANOSTRUCTURES AND METHOD FOR FABRICATING SUCH NANOSTRUCTURES

CROSS REFERENCE TO RELATED APPLICATIONS

This application claims the benefit of U.S. Provisional Application Ser. No. 60/547,689 filed by Dong-Wook Kim, et al. on Feb. 25, 2004 and entitled "Article Comprising Metal Oxide Nanostructures and Method for Fabricating Such Nanostructures". The '689 provisional application is incorporated herein by reference.

FIELD OF THE INVENTION

This invention relates to metal oxide nanostructures such as tubes and cones, and, in particular, to such structures made using carbon nanostructures as templates.

BACKGROUND OF THE INVENTION

Metal oxides have a great potential in various applications due to their interesting physical properties, such as superconducting, semiconducting, ferroelectric, piezoelectric, pyroelectric, ferromagnetic, optical (electro-optic, non-linear optic, and electrochromatic), resistive switching, and catalytic behaviors. Nano-scaled oxide materials have attracted great interest in the last decade because they can exhibit different physical properties than their bulk counterparts. See U.S. Pat. No. 6,036,774 by Lieber, et al "Method of producing metal oxide nanorods" issued on Mar. 14, 2000; Huang et al., Science, Vol. 292, p. 1897 (2001); Aggarwal et al., Science, Vol. 287, p. 2235 (2000); Li et al., Applied Physics Letters, Vol. 82, p. 1613 (2003); Luo et al., Applied Physics Letters, Vol. 83, p. 440 (2003). The oxide nanostructures were prepared by several growth techniques: laser ablation, sputtering, chemical vapor deposition, sol-gel, and molecular-beam-epitaxy. One of the simplest methods is to prepare the nanostructures, such as nanorods, in a tube furnace by the 'vapor-liquid-solid' mechanism suggested by Lieber et al.

Huang et al. demonstrated room-temperature ultraviolet lasing in ZnO nanowire arrays. The nanostructures were used as an optical cavity for lasing. Aggarwal et al. suggested their spontaneously formed oxide "nano-tip" array as a possible candidate for field emission applications. Li et al. presented an approach to use individual $In_2O_3$ nanowire transistors as chemical sensors, where ultrahigh surface-to-volume ratios were expected to improve the sensitivity. Luo et al. fabricated ferroelectric nanoshell tubes using Si and alumina hole arrays as templates. The nanoshell tubes could be useful for nano-electromechanical system. These results show that nanostructures can be useful for their unique structural advantages.

Carbon nanostructures, such as nanotubes, nanofibers and nanocones, (collectively "CN") and their peculiar characteristics, such as field emission and field effect transistor effects, have also evoked great attention. In recent years, growth techniques for CN were intensively investigated and relatively well established. See Ren et al., Science, Vol. 282, p. 1105 (1998); Bower et als., Applied Physics Letters, Vol. 77, p. 830 (2000); Merkulov et al., Applied Physics Letters, Vol. 79, p. 1178 (2001); Tsai et al., Applied Physics Letters, Vol. 81, p. 721 (2002); Teo et al., Nanotechnology, Vol. 14, p. 204 (2003).

High-quality single-walled carbon nanotubes are typically grown as randomly oriented, needle-like or spaghetti-like, tangled nanowires by laser ablation or arc techniques (a chemical purification process is usually needed for arc-generated carbon nanotubes to remove non-nanotube materials such as graphitic or amorphous phase, catalyst metals, etc). Chemical vapor deposition (CVD) methods such as used by Ren et al., Bower et al., and Teo et al. tend to produce multiwall nanotubes attached to a substrate, often with a semi-aligned or aligned, parallel growth perpendicular to the substrate. Also Merkulov et al., Tsai et al., and Teo et al. demonstrated that carbon nanofibers and nano-cones can be grown in optimum conditions, for example by varying gas ratio and voltage bias.

As described in the cited articles, catalytic decomposition of hydrocarbon-containing precursors such as ethylene, methane, or benzene produces CN when the reaction parameters such as temperature, time, precursor concentration, flow rate, are optimized. Catalyst layers such as thin films of Ni, Co, Fe, etc. are often patterned on the substrate to obtain uniformly spaced CN array. Furthermore, the patterning of catalysts makes it possible to tailor the geometry (diameter controlled by catalyst size, height controlled by deposition time) of CN the demands for various applications. The catalyst dots can be patterned by various techniques: self-assembly, unconventional lithography (for example, nanosphere lithography), and e-beam lithography. Careful patterning and growth enables production of carbon nanotubes with remarkable uniformity in diameter and height (standard deviations ~5%), as reported by Teo et al.

While oxide nanostructures can be fabricated using various available techniques, the most frequently desired structural configurations such as well-defined, vertically aligned and periodically spaced nano oxide wires are not easily obtainable. In addition, some of the unique structures, such as a hollow oxide nanotubes and hollow oxide nanocones, are not easily synthesized using conventional techniques. Accordingly there is a need for improved methods of making oxide nanostructures.

SUMMARY OF THE INVENTION

This application discloses convenient and novel processing techniques of fabricating oxide nanostructures, some in the form of surface coating, some in the form of nanocomposites, and some in the form of oxide nanotubes or nanocones. The techniques utilize aligned carbon nanotubes or nanocones as growth templates. The carbon template is optionally burned away by heat treatment in an oxidizing atmosphere to create hollow and open oxide nanotubes or nanocones. The resulting novel structures can be useful for articles and devices such as nano sensor arrays, field emission devices such as field emission displays, nanoscale ferromagnetic or ferroelectric memories, nano-reactors, nano catalyst arrays, fuel cells, room temperature UV lasers for higher optical memory density, and nano-electromechanical devices.

BRIEF DESCRIPTION OF THE DRAWINGS

For a better understanding of the invention, exemplary embodiments are described in connection with the accompanying drawings, in which:

FIGS. 1(*a*), 1(*b*) and 1(*c*) schematically illustrate an exemplary fabrication process for an oxide nanotube array using carbon nanotube/nanofiber array as a template;

FIGS. 2(*a*), 2(*b*) and 2(*c*) schematically show a fabrication process for an oxide nano-cone array using carbon nano-cone as a template;

FIGS. 3(*a*) through 3(*d*) schematically illustrate an exemplary fabrication process for an oxide nanotube array;

FIGS. 4(*a*) through 4(*d*) schematically show an exemplary fabrication process for an oxide nano-cone array;

FIGS. 5(*a*) and 5(*b*) illustrate cross-sectional views of a metal oxide nanostructure before and after oxidation;

FIG. 6 is cross-sectional view of a nano-tip oxide field emitter;

FIG. 7 illustrates schematic field emission display using the aligned oxide nanostructure array;

FIG. 8 illustrates an example of nano sensor array; and

FIGS. 9(*a*) and 9(*b*) illustrate UV laser emitters comprising aligned ZnO nanostructures.

It is to be understood that these drawings are for the purposes of illustrating the concepts of the invention and are not to scale.

DETAILED DESCRIPTION

In the prior art, a variety of quasi-one-dimensional oxide nanostructures, such as nanorods, nanowires and nanobelts, have been fabricated. The synthesis commonly involves a vapor phase (e.g., growth by laser ablation or chemical or physical vapor deposition), and a vapor-liquid-solid (VLS) mechanism. In this growth mode, a liquid metal cluster acts as an energetically favored site for the absorption of gas-phase reactants. The cluster supersaturates and grows into a one-dimensional wire of the material with the alloy cluster atop the wire. The resulting wire morphology depends on experimental parameters such as temperature, pressure, and the nature of the metal catalyst. As suggested by Lieber et al., VLS can be employed to grow various metal oxide materials. Several oxide nanostructures were also prepared by chemical vapor deposition, sol-gel, molecular-beam-epitaxy, and other techniques. However, the use of chemical processes to fabricate oxide nanostructures often introduces many difficult to control processing variables, requires chemically toxic gases, and results in unoriented, randomly distributed nanostructures.

In order to overcome these problems, the present invention employs novel physical vapor deposition processes. To realize useful devices, it is often required to control alignment, geometry, and growth location of nano-features. To achieve such a structure in metal oxide nanostructures, the inventive process utilizes substrate-supported carbon nanostructures (such as nanotubes and carbon nanocones) as templates. The preferred carbon nanostructures are nanostructures such as nanotubes, nanocones and nanowires that project outwardly from the substrate surface. This process uses the fact that carbon nanostructure aligned growth has been well established, often without involving toxic gases. Growth of the carbon nanostructures at specific location can be achieved by patterning of catalyst metal islands. Also, controlling the diameter of the catalyst islands enables one to obtain the nanostructures with desired diameter.

Referring to the drawings, FIG. 1 illustrates an exemplary, versatile and simple fabrication technique for growing an oxide nanotube array 10 by a physical vapor deposition. A carbon nanotube/nanofiber array 10 supported by a substrate 11 can be prepared by conventional CVD technique (FIG. 1. (a)). If patterning of catalyst dots is used, a regularly spaced array of nanotubes 12 can be obtained. The patterning also enables one to control the geometry (diameter controlled by catalyst size, height controlled by deposition time) of carbon nanotubes/nanofibers 12. See Teo et al. cited above. Instead of conventional lithography (e-beam lithography and photolithography), some cost-effective patterning methods, such as self-assembly, polymeric approach, nano-sphere lithography, and shadow mask technique also can be used to prepare catalyst island array for growing the nanotube array 10.

The next step of the processes to form the oxide nanostructures is to deposit a thin film 13 of a metal A on the surface of the carbon nanotubes/nanofibers 12 in the array 10 (FIG. 1 (*b*)), for example using sputtering, evaporation or even CVD. Because of the shadow effect by neighboring nanotubes, it is difficult to uniformly coat the nanotubes/nanofibers 12 especially if the length-to-diameter aspect ratio is high. In this case, source beam is 14 desirably obliquely incident on the substrate and rotation of the substrate is also utilized. When the mean free path of molecules is much smaller than the distance between the source and the substrate (like a typical sputtering environment), such a shadowing effect is much smaller than in the case of evaporation processes.

The third step is to oxidize the coated metal layer on the nanotube array. The metal (A) can be oxidized to form metal oxide ($A_MO_N$) by heating the sample in oxygen ambient atmosphere containing, for example, oxygen gas, atomic oxygen, ozone, oxygen plasma, $NO_2$, and $N_2O$. A partial atmosphere such as incorporating inert gas may also be used. The desired oxidizing temperature is typically in the range of 200-2000° C., preferably in the range of 400-1400° C. The desired heat-treatment time is in the range of 1 second to 500 hours, preferably 10-600 minutes. The completed structure is an oxide-coated carbon nanostructure 15, the surface oxide of which can be utilized for a variety of devices dependent on aligned nanoscale oxide configuration. An alternative way of creating the oxide coating on the CN surface, is to directly deposit oxide material, for example, by using a RF (radio frequency) sputtering or CVD.

An alternative configuration of the inventive oxide nanostructure is to remove all or a part of the carbon nanostructure (CN) template underneath. For some device applications, removal of the carbon simplifies the structure and minimizes a possible complication arising from the presence of carbon, especially since the carbon is electrically conductive while the oxide is often dielectric. Such a carbon-free oxide nanostructure array can be accomplished by exposing the carbon underneath to an oxidizing atmosphere during heat treatment and burning away the carbon as CO or $CO_2$ gas.

In order to effectuate such a removal, the metal (or metal oxide) coating is made to be semi-permeable to gases ($O_2$, CO or $CO_2$). Such a semi-permeable coating can be provided by a careful control of the metal coating process and thickness. A relatively fast deposition or lower temperature deposition of metals tends to create less dense structure. The permeable coating structure has a density of less than 96%, preferably less than 90%.

An alternative process to allow access of oxygen to the carbon is to remove a part of the metal coating (or metal oxide coating) at the upper-end portion of the coated CN structure to expose the carbon. Such an exposed structure is obtained by plasma etching, for example using an oxide plasma. The structure is then subjected to an oxidizing heat treatment. During this oxidation, carbon nanotubes/nanofibers are etched away as carbon oxide gas. Thus a metal oxide ($A_MO_N$) nanotube 15 array can be obtained (FIG. 1

(*c*)). The application is not limited to binary oxides. If the deposited metal is an alloy (e.g., $A_LB_M$), a complex oxide of, $A_LB_MO_N$ can be obtained.

Exemplary oxide nanostructures that can be fabricated according to the inventive processes include semiconducting or dielectric oxides such as ZnO, $TiO_2$, $MnO_2$, SnO, $ZrO_2$, $V_2O_5$, $SiO_2$, $CrO_2$, $Cr_2O_3$, MgO, $Al_2O_3$, ferroelectric oxides (such as $BaTiO_3$, $(Pb,La)(Zr,Ti)O_3$, $SrBi_2Ta_2O_9$, and $(Bi,La)_4Ti_3O_{12}$), magnetic oxides (such as magnetite, Ba-ferrite, Ni—Zn ferrite), superconductive oxides (such as $YBa_2Cu_3O_7$), and magneto-resistive oxides (such as La—Ca—Mn—O or La—Sr—Mn—O).

FIGS. 2 (*a*)-(*c*) illustrate an inventive process of fabricating a metal oxide nano-cone array. Most of the processing principles are similar to those for the nanotube array describe above. In this case, carbon nano-cone array 20 is used as a permanent or a sacrificial template. The geometry of the cones 21 with the slanting side illustrated in FIG. 2 is especially advantageous, as compared to the nanotube or nanofiber configuration of FIG. 1, in that the deposition of metal 22 becomes much easier and convenient as a standard, vertical deposition can be employed, thus omitting the oblique incident beam arrangement and the substrate rotation. The metal 22 is then oxidized to a metal oxide layer 23 as shown in FIG. 2(*c*). The carbon nanocone template may be left as a permanent base or the carbon can be burned away using an oxidizing heat treatment similarly as in the case of carbon nanotube or nanofiber removal discussed earlier. Semi-permeable metal coating or plasma etching removal of metal from a small area near the cone tips may be employed.

As the nanocone fabrication steps often involve high temperature CVD processing at several hundred degrees centigrade, it is noted that depending on the specifics of nanotube fabrication, the carbon nanocones sometimes contain a varying amount of other elements such as silicon or oxygen diffused from the silicon or silicon oxide substrate into the nanocone structure during the high temperature fabrication. Allowable types of other elements in the nanocones (and in nanotubes but with a much less extent) include Si, Ga, As, Al, Ti, La, O, C, B, N, and other substrate-related elements. The amount of such elements can be very small or substantial depending on the temperature, time, and electric field applied during the CVD processing, for example in the range of 0.5 to 70 atomic percent.

During the growth of CN, catalyst particles are sometimes retained at the tip. In most cases, the catalyst particles are transition metals and they are readily oxidized. For some applications, it will be necessary to remove this oxide of transition metal in order to avoid possible device performance complications. To meet such a need, a modified fabrication method is disclosed as shown in FIG. 3. Here carbon nanotubes/nanofibers 30 are prepared (FIG. 3 (*a*)) and an etching step to remove the catalyst nano-particles 31 is applied before deposition of a metal thin film 32 (FIG. 3 (*b*)). Etching of the catalyst metal particle 31 (typically Ni, Fe or Co for carbon nanotube growth) can be done by either dry etching (e.g., fluorine-based reactive ion etching or oxygen plasma etching) or wet etching (e.g., using a solution of phosphoric acid and nitric acid). Once the catalyst metal particles are removed, subsequent processes of metal thin film deposition (FIG. 3 (*c*)) and oxidation (FIG. 3 (*d*)) are carried out to form a final structure of an array of oxide nanotubes. A similar process can be applied to nano-cones 40 as illustrated in FIG. 4.

FIGS. 5 (*a*) and 5 (*b*) schematically illustrate cross-sections of the nanotube tip geometry before and after oxidation, respectively. The diameter of the open end 50 of a nanotube or nanowire 51 can be reduced after oxidation of metal 52 due to the addition of oxygen, and can even be completely closed by the metal oxide 53 if the catalyst particles (not shown) are small and the deposited metal film has a large volume expansion ratio during oxidation. Such a closed or semi-closed tip structure can be useful for special nanostructure array applications, for example, to store liquid, gas, or pharmaceutical drug before the moment of device operation. Fuel storage (such as liquid fuel or hydrogen for fuel cells) or drugs for controlled delivery are some applications.

The oxide nanostructure array has several desirable characteristics particularly useful for device applications. They include the very large surface area associated with the nanoscale and vertically elongated structure, which can be useful for enhancing the kinetics chemical, catalytic or other reactions. The sharp tip configuration with high aspect ratio, in combination with a vertically aligned and laterally spaced array structure can be useful for electron field emitter applications. The cone-shaped configuration provides mechanical sturdiness of the nanostructure, much better than in the case of the nanotube or nanofiber configuration. The hollow inside in some of the inventive configurations (when the carbon template is burned away) can provide many, nanoscale storage reservoirs for liquid or gaseous fuel, medicine, chemical reactant, and catalysts for nanoscale chemical reactors or sensor applications. The presence of many nanoscale and periodically placed nanoscale oxide elements can also be utilized for ferroelectric or ferromagnetic memory applications. Some of these device applications are described below.

Nano-Tip Field Emitters

In vacuum microelectronics, great attention has been paid on the application of field-emitters to flat-panel field-emission displays (FED's), RF amplifiers, multi-beam electron-beam lithography, specialty lamps, and nanoscopic X-ray sources. All of these require stable field emitters with sufficiently large emission current.

An important issue in field emitters is their stability with the residual ambient gas. Particularly important is that the field emitter tips made of refractory metals like molybdenum, niobium, and tungsten are susceptible to oxidation. Such field emitters were disclosed by Chalamala et al. in U.S. Pat. No. 6,091,190, "Field emission device", issued on Jul. 18, 2000. In the present invention, sharp metal (e.g., Mo) tip field emitters can have a novel surface passivation layer made from oxides of one of the metals selected from Ba, Ca, Sr, In, Sc, Ti, Ir, Co, Sr, Y, Zr, Ru, Pd, Sn, Lu, Hf, Re, La, Ce, Pr, Nd, Pm, Sm, Eu, Gd, Tb, Dy, Ho, Er, Tm, Yb, Th, and combinations thereof. The oxide is helpful in improving the emission stability. Moreover its work function is less than that of molybdenum.

Referring to the drawings, FIG. 6 is a schematic cross-sectional illustration of an exemplary inventive field emitter, which is prepared by using a carbon nanocone 61 (which can be removed if desired) as a template. The field emitter 60 comprises two layers, an oxide passivation layer ($A_MO_N$) 62 and metal layer 63 (e.g., Mo). This structure can be fabricated following the process shown in FIG. 2, but multilayer of A/Mo should be grown on the carbon nano-cones in the step corresponding to FIG. 2 (*b*). An ensuing oxidation step can oxidize top-most metal (A) layer to form oxide ($A_MO_N$). Carbon nanotubes/nanofibers also can be used as templates and similar process can be applied to prepare tube-type nano-tip array, as illustrated in FIG. 1.

The inventive 'nano-tip field emitters' is a robust electron source, since it takes the advantages from both the carbon nano-cone (high aspect ratio and sharp tip geometry useful for electric field concentration) and the passivated Spindt-type emitter (high tolerance in ambient). Such a high aspect ratio can greatly reduce the turn-on voltage for field emission. Metal (e.g., Mo) films or underlying carbon can provide a good conduction path for electron transport during electron emission, which can produce a large emission current.

A field emission display device incorporating the inventive field emitter array is schematically illustrated in FIG. 7. The display device of FIG. 7 uses one or more arrays 70 of field emitters such is shown in FIG. 6 disposed on a cathode substrate 71 to emit electrons. Emission is partially controlled by respective gate electrode 72 which can be supported overlying the emitters by an insulating pillar 73. Emitted electrons are attracted into collision with an anode/phophor assembly 74 and the resulting light can be seen through a glass plate 75.

Nano Sensor Array

A sensor array system is useful for clinical, environmental, health and safety, remote sensing, military, food/beverage and chemical processing applications. This array contains several gas sensors, such as metal oxides ($SnO_2$, ZnO, CdO, $PbCrO_4$, $Fe_2O_3$, $TiO_2$, $ThO_2$, $MoO_3$, $V_2O_5$, $MnO_2$, $WO_3$, NiO, CoO, $Cr_2O_3$, $Ag_2O$, $In_2O_3$, and so on). The sensor array displays the capacity to identify and discriminate between a variety of vapors by virtue of small site-to-site differences in response characteristics. Such a sensor array was disclosed by Hoffheins et al. in U.S. Pat. No. 5,654,497, "Motor vehicle fuel analyzer", issued on Jun. 3, 1996. Various fabrication methods have been developed, for example, McDevitt et al. in U.S. Pat. No. 6,649,403, "Method of preparing a sensor array" issued on Nov. 18, 2003.

FIG. 8 schematically illustrates an exemplary inventive sensor array 80, which is prepared by using carbon nanocones as templates. In order to prepare a multifunctional sensor capable of detecting different gas or different physical or chemical stimuli, various kind of metals (A, B, C, . . . ) are deposited on different sets of nanocone templates (81, 82, and 83, respectively) on a wafer. Such a selective deposition can be carried out, for example, by using a shadow mask which allow a selective thin film deposition of metal A (or the oxide $AO_x$) in a rectangular area at the bottom of FIG. 8. The shadow mask is then moved to the middle area rectangle for deposition of metal B (or the oxide $BO_x$). Such a step is repeated in order to produce as many areas as desired for sensing of each specific gas. A metal oxide array obtained by such a processing is illustrated in FIG. 8, which shows an example of nano-cone templates 84 coated with different metal-oxide sensors. A set of electrodes 85 is prepared for each set of metal oxide sensors as shown in FIG. 8. These electrodes are connected to a detection system for interrogation/analysis of the obtained signals. The large total surface area from many sensor nanowires within each set adds to the total cumulative signal amplitude.

The inventive 'nano sensor array' is very sensitive, since it has a ultrahigh surface-to-volume ratio. Moreover, with a nanoscale patterning, a very large number of sensor sets can be incorporated for detection of many different types of chemical or physical stimuli.

The application of the inventive oxide nanostructure array is not limited to a chemical sensor. Resistances of some metal oxides are varied under light (e.g., $In_2O_3$) or magnetic field (e.g., perovskite manganese oxides such as $La_{1-x}Ca_xMnO_3$). Those materials can be used for photodetectors and magnetic field sensors. Also some metal oxides generate electric current when heat (pyroelectric materials) or pressure (piezoelectric materials) is applied. These properties can be utilized for infrared sensors and pressure sensors. In all these cases, sensitivity of the oxide nanostructure disclosed in this invention is much higher than that for the conventional planar thin films due to its enormous surface area.

The inventive oxide nanostructures can also be useful for optoelectronic applications. For example, it is demonstrated that ZnO nanowires can produce room temperature UV (ultraviolet) laser. See articles by Y. C. Kong et al, Applied Physics Letters Vol. 78, p. 407 (2001) and M. Huang et al., Science, Vol. 292, p. 1897 (2001). ZnO is a direct wide-bandgap semiconductor with its bandgap of 3.37 eV at room temperature which is suitable for short wavelength laser or diode applications such as UV or blue emitters. Such short wavelengths can allow higher optical memory densities for CD (compact disk) devices or magneto-optical memory devices. Due to the much larger exciton binding energy of about 60 meV in ZnO as compared to other large bandgap semiconductors (~25 meV for GaN and ~22 meV for ZnSe), the excitons in ZnO are thermally stable at room temperature thus providing an extra advantage. As illustrated schematically in FIG. 9, an aligned oxide nanostructure 90 comprising the ZnO coating on the carbon nanotube template 91, FIG. 9(*a*), or a similar structure 92 comprising ZnO nanotubes only after the removal of carbon template inside, FIG. 9(*b*), can thus be useful as an efficient UV or blue light emitter device.

The aligned oxide nanostructure can also be useful for ferroelectric or ferromagnetic memory devices. An exemplary oxide ferroelectric memory material is barium titanate ($BaTiO_3$), and an exemplary ferromagnetic oxide memory material is barium hexaferrite (Please Check This. $BaO.6Fe_2O_3$). For such memory devices, the gap between the nanowires in the aligned oxide nanostructure of FIG. 1(*b*) or FIG. 1(*c*) can be filled with nonfunctional materials such as a polymer or physically deposited (e.g., by RF sputtering) aluminum oxide, then the top surface is polished flat (e.g., by chemical mechanical polishing technique), and electrodes as well as electrical or magnetic interrogation circuits are added so as to induce or detect changes in stored electrical charge or magnetic moment.

The inventive nano oxide arrays such as solid, composite or hollow nanowire or nanocone array of oxides are also useful for other device applications such as nano-reactors, nano catalyst arrays, fuel cells, and nano-electromechanical devices.

It can now be seen that one aspect of the invention is a method of making an array of metal oxide nanostructures comprising the steps of providing a substrate including an array of projecting carbon nanostructures and forming a metal oxide coating overlying the surface of the carbon nanostructures. The metal oxide coating can be formed by depositing the metal and oxidizing the deposited metal to form the array of metal oxide nanostructures. Or the metal oxide coating can be deposited overlying the carbon nanostructures. The substrate typically has a major surface and the carbon nanostructures are advantageously disposed in a two dimensional array on the surface. Preferably the carbon nanostructures are disposed in a substantially equal spaced, spaced-apart array as by appropriate disposition of catalyst islands, and they may advantageously have substantially uniform height above the substrate. The remains of the catalyst islands can be etched away after carbon nanostructures are grown. The projecting carbon nanostructures can be nanotubes, nanowires or nanocones.

In depositing the metal coating or the metal oxide coating, the material may be deposited at an oblique angle to the substrate surface, and the substrate surface can be rotated to reduce shadowing of nanostructures by neighboring nanostructures.

Deposited metal can be oxidized by heating in an oxidizing gas ambient at a temperature in the range 200-200° C. for 1 second to 500 hrs. and preferably at a temperature in the range 400-1400° C. for 10 to 600 minutes. The metal can be an elemental metal or an alloy. Typical useful metals include Zn, Ti, Mn, Sn, Zr, V, Si, Cr, Mg, Al, Fe, Ba, Fb, La, Sr, Bi, Ta, Cu, Ca and their alloys.

After the carbon nanostructures have served as a template for the formation of metal or metal oxide coatings, the carbon can be removed as by heating in an oxidizing atmosphere.

Another aspect of the invention is the resulting article comprising a substrate including an array of projecting metal oxide nanostructures. The oxide nanostructures can be in the form of nanotubes, nanocones or nanowires. The nanostructures can be disposed in a spaced-apart two dimensional array, preferably with substantially equal spacing and substantially uniform height above the substrate. The article can be, among other things, a field emission structure using the oxide nanostructures as nanotip field emitters. It can also be used as a nanosensor array.

It is understood that the above-described embodiments are illustrative of only a few of the many possible specific embodiments which can represent applications of the invention. Numerous and varied other arrangements can be made by those skilled in the art without departing from the spirit and scope of the invention.

What is claimed is:

1. A method of making an array of metal oxide nanostructures comprising the steps of:

providing a substrate supporting an array of projecting carbon nanostructures; and forming a metal oxide coating overlying the surfaces of the carbon nanostructures.

2. The method of claim 1 wherein the metal oxide coating is formed by depositing a metal coating overlying the surfaces of the carbon nanostructures and oxidizing the metal coating.

3. The method of claim 1 wherein the metal oxide coating is formed by depositing a metal oxide coating overlying the surfaces of the carbon nanostructures.

4. The method of claim 1 wherein the substrate has a major surface and the carbon nanostructures are disposed in a two dimensional array on the surface.

5. The method of claim 1 wherein forming the metal oxide coating includes sputtering, evaporating or chemical vapor disposition.

6. The method of claim 1 wherein the projecting carbon nanostructures are selected from the group consisting of nanotubes, nanowires and nanocones.

7. The method of claim 2 wherein the metal coating is formed by depositing material at an oblique angle to the substrate and rotating the substrate to reduce shadowing of a carbon nanostructure neighboring nanostructures.

8. The method of claim 2 wherein the metal is oxidized by heating in an oxidizing gas ambient to a temperature in the range 200-2000° C. for 1 second to 500 hrs.

9. The method of claim 2 wherein the metal is oxidized by heating in an oxidizing gas ambient to a temperature in the range 400-1400° C. for 10 to 600 mins.

10. The method of claim 2 wherein the metal comprises a metal selected from the group consisting of Zn, Ti, Mn, Sn, Zr, V, Si, Cr, Mg, Al, Fe, Ba, Pb, La, Sr, Bi, Ta, Cu, Ca and their alloys.

11. The method of claim 2 wherein the metal comprises an alloy.

12. The method of claim 1 further comprising:

removing the carbon nanostructures subsequent to forming the metal oxide coating.

13. The method of claim 12 wherein the carbon nanostructures are removed by heating in an oxidizing atmosphere.

14. The method of claim 2 wherein the carbon nanostructures are carbon nanocones and the metal coating is formed by deposition of metal substantially vertical to the substrate.

15. The method of claim 1 wherein the substrate supporting an array of carbon nanostructures is provided by the steps of forming an array of catalyst islands on the substrate, growing nanostructures in the regions of the catalyst islands, and etching away remaining catalyst island material.

16. The method of claim 1 wherein the oxide nanostructures are oxide nanotubes and including the step oxidizing the distal end regions of the tubes to substantially close the tubes to facilitate storage of liquids or gases.

* * * * *